United States Patent
Sasaki et al.

(10) Patent No.: US 7,333,683 B2
(45) Date of Patent: Feb. 19, 2008

(54) STRUCTURE AND METHOD FOR MOUNTING LSI PACKAGE ONTO PHOTOELECTRIC WIRING BOARD, INFORMATION PROCESSING APPARATUS, OPTICAL INTERFACE, AND PHOTOELECTRIC WIRING BOARD

(75) Inventors: Junichi Sasaki, Tokyo (JP); Ichiro Hatakeyama, Tokyo (JP); Kazunori Miyoshi, Tokyo (JP); Hikaru Kouta, Tokyo (JP); Kaichiro Nakano, Tokyo (JP); Mikio Oda, Tokyo (JP); Hisaya Takahashi, Tokyo (JP); Mitsuru Kurihara, Tokyo (JP)

(73) Assignee: NEC Corproation, Tokyo (JP)

( * ) Notice: Subject to any disclaimer, the term of this patent is extended or adjusted under 35 U.S.C. 154(b) by 134 days.

(21) Appl. No.: 11/245,334

(22) Filed: Oct. 7, 2005

(65) Prior Publication Data

US 2006/0078248 A1 Apr. 13, 2006

(30) Foreign Application Priority Data

Oct. 7, 2004 (JP) .............................. 2004-294520

(51) Int. Cl.
*G02B 6/00* (2006.01)
(52) U.S. Cl. .......................................... 385/14; 385/88
(58) Field of Classification Search ..................... None
See application file for complete search history.

(56) References Cited

U.S. PATENT DOCUMENTS 5,394,490 A * 2/1995 Kato et al. .................... 385/14
6,343,171 B1 * 1/2002 Yoshimura et al. ........... 385/50
6,477,286 B1 * 11/2002 Ouchi .......................... 385/14
2002/0061154 A1 * 5/2002 Tsukamoto et al. ........... 385/14
2002/0085254 A1 * 7/2002 Kurata et al. ............... 359/152
2002/0196997 A1 * 12/2002 Chakravorty et al. ......... 385/14
2004/0033008 A1 * 2/2004 Mikawa et al. ............... 385/14

FOREIGN PATENT DOCUMENTS

| JP | 02-158071 | 6/1990 |
| JP | 05-251717 | 9/1993 |
| JP | 2000-249873 | 9/2000 |
| JP | 2000-332301 | 11/2000 |
| JP | 2002-189137 | 7/2002 |
| JP | 2004-085913 | 3/2004 |

* cited by examiner

*Primary Examiner*—Rodney Bovernick
*Assistant Examiner*—Mike Stahl
(74) *Attorney, Agent, or Firm*—Young & Thompson

(57) ABSTRACT

An LSI package having an optical interface is mounted on a surface of a photoelectric wiring board. The photoelectric wiring board and the optical interface are optically connected with sufficient precision. A wiring board side guide member including socket pins and guide pins is soldered and fixed onto the photoelectric wiring board including an optical transmission line, a guide pin, and a mirror. An optical interface side guide member having a fitting hole is glued to the optical interface. The optical interface is mounted on an interposer of the LSI package. The guide pin of the photoelectric wiring board is fitted into the fitting hole formed through the interposer. The guide pin of the guide member is fitted into the fitting hole of the guide member. As a result, position alignment between the optical interface and the photoelectric wiring board is conducted with high precision.

33 Claims, 7 Drawing Sheets

US 7,333,683 B2

STRUCTURE AND METHOD FOR MOUNTING LSI PACKAGE ONTO PHOTOELECTRIC WIRING BOARD, INFORMATION PROCESSING APPARATUS, OPTICAL INTERFACE, AND PHOTOELECTRIC WIRING BOARD

BACKGROUND OF THE INVENTION

1. Field of the Invention

The present invention relates to a structure for mounting an LSI package onto a photoelectric wiring board, and its mounting method. In particular, the present invention relates to a mounting structure for mounting an optical interface having an optical element and an LSI package having an LSI chip mounted thereon onto a photoelectric wiring board, and its mounting method.

2. Related Art

For the transmission of signals between LSIs or between an LSI and a backplane in information devices such as routers and servers, the optical signal transmission system that is fast in speed and low in crosstalk and noise is being adopted. When forming an optical signal transmission system in this case, the method for mounting the optical interface to conduct photoelectric conversion (or electro-optic conversion) poses a problem. For mounting an LSI package having an optical interface onto the surface of a photoelectric wiring board having an optical transmission line and electric wiring laid down on a substrate, optically connecting the photoelectric wiring board to the optical interface with a sufficient precision, and raising the practicality, first, it is necessary that optical axis alignment between a plurality of optical elements mounted on the optical interface and the optical transmission line can be achieved with a sufficient precision. For example, in the case where the optical transmission line is a multi-mode optical waveguide having a core section shape of 40 μm square, the allowable optical axis misalignment quantity is 20 μm or less. Secondly, it is necessary that positioning and fixing can be conducted with high work efficiency and high precision without conducting complicated optical axis adjustment work, considering the mass production efficiency of products. Thirdly, from the viewpoint of the apparatus maintenance and easiness of modification, it is necessary that only an LSI package can be replaced easily without melting solder or using a chip bonder when replacing the LSI package.

As for a structure for mounting an LSI package having an optical interface onto a photoelectric wiring board, a technique using solder bumps for the mounting is known (see, for example, JP-A-2000-332301). FIG. 1A is an oblique view of a conventional example described in JP-A-2000-332301. FIG. 1B is its partial section view taken along a 1B-1B line. In this conventional example, an optical element array 12 is mounted directly on an LSI chip 11 by using solder bumps 13 as shown in FIGS. 1A and 1B. The LSI chip 11 is mounted on a print-circuit board 17 having an optical waveguide 16 mounted thereon, by using metal posts 14 and solder bumps 15. In this structure, optical axis alignment between an optical element and the waveguide is automatically achieved without adjustment owing to a self-alignment effect obtained at the time of solder bump fusion. Therefore, it is possible to satisfy the above-described first and second requirements.

Furthermore, a technique for positioning an optical fiber on an optical element by using an optical fiber connector and a receptacle is also known (see, for example, JP-A-5-251717). FIG. 2 is a sectional view of a conventional example described in JP-A-5-251717. In this conventional example, a semiconductor chip 21 having a wiring layer 21a and having an optical element 22 embedded within a substrate is mounted on a base 24 having a receptacle 25 mounted thereon and having input & output pins planted thereon. Furthermore, other semiconductor chips 23 are mounted on the wiring layer 21a of the semiconductor chip 21. An optical fiber connector 27 is connected to an optical fiber cable 26. The optical fiber cable 26 is optically coupled to the optical element 22 by fitting connector pins 25a of a receptacle 25 into guide holes 27a of the optical fiber connector 27.

SUMMARY OF THE INVENTION

In the technique disclosed in JP-A-2000-332301, however, the optical element array and the LSI chip are fixed by fusion of the solder bumps. As a result, the optical element array is semi-permanently fixed on the LSI chip, and the LSI chip is semi-permanently fixed on the print-circuit board. Therefore, it is difficult to replace components on the maintenance spot for an information processing apparatus. This is because chip mounting equipment required for component replacement using solder bump melting is not typically installed on the maintenance spot for an information processing apparatus, and consequently it is necessary to bring a board into an assembly factory and replace the optical element or the LSI chip. In this conventional example, therefore, the above-described third requirement is not satisfied.

In the technique disclosed in JP-A-251717, all of the optical element and the LSI chip are mounted in the package as a module. Although the module can be easily attached to and detached from the optical fiber cable, therefore, it is necessary to control the position of fixing the optical element in the semiconductor substrate and the position of the receptacle to the base with high precision when manufacturing the module. A sophisticated processing technique and a sophisticated mounting technique become necessary, resulting in an increased module cost. In other words, in this conventional example, the above-described second requirement is not satisfied. In the structure of this conventional example, it is obligatory to replace the whole module when a trouble has occurred in a semiconductor element, resulting in an effectively high maintenance cost.

In the conventional techniques, all of the above-described first to fifth requirements cannot be satisfied as heretofore described. This results in a problem that it is not possible to optically connect the photoelectric wiring board to the optical interface with a sufficient precision, a high work efficiency, and at a low cost and provide a module having high practicality and a high maintenance efficiency.

An object of the present invention is to solve the problems heretofore described and provide a structure and a method for mounting an LSI package having an optical interface onto a photoelectric wiring board with a low price, a high precision and excellent practicality and maintenance efficiency.

In order to achieve the object, the present invention provides a structure for mounting an LSI package onto a photoelectric wiring board, the structure including a photoelectric wiring board having an optical transmission line, an LSI chip electrically connected to the photoelectric wiring board, and an optical interface for accommodating an optical element optically coupled to the optical transmission line, the optical interface being electrically connected to the LSI chip, wherein a first guide member and a second guide member are stuck to the photoelectric wiring board and the optical interface, respectively, and the first guide member and the second guide member are positioned to each other and mechanically coupled to each other. In the present invention, positioning of the optical interface and the photoelectric wiring board can be conducted by conducting position adjustment of the guide members. Therefore, a high precision working technique is not required for the optical interface with respect to the package.

In order to achieve the object, the present invention provides a method for fabricating a structure including a photoelectric wiring board having an optical transmission line, an LSI chip electrically connected to the photoelectric wiring board, and an optical interface for accommodating an optical element optically coupled to the optical transmission line, the optical interface being electrically connected to the LSI chip, the method including (1) a process for sticking an optical input & output point of the photoelectric wiring board to a predetermined point of a first guide member while keeping them in a predetermined relative position relation, (2) a process for sticking a light receiving & sending point of the optical interface to a predetermined point of a second guide member while keeping them in a predetermined relative position relation, and (3) a process for positioning the first guide member and the second guide member to each other and mechanically coupling them to each other so as to be separable, and thereby optically coupling the optical transmission line and the optical interface to each other, and electrically connecting the LSI chip to the photoelectric wiring board.

In accordance with the present invention, a guide member is mounted on each of a photoelectric wiring board and an optical interface with high precision. Positioning is conducted by fitting these guide members each other. According to the present invention, optical axis alignment between a plurality of optical elements mounted on the optical interface and a optical transmission line can be achieved with sufficient precision without conducting complicated optical axis adjustment work when mounting an LSI package including the optical interface on the photoelectric wiring board. Furthermore, a structure for maintaining electrical connection between the LSI package and the photoelectric wiring board by elastic force is adopted. When replacing the LSI package, therefore, only the LSI package can be replaced easily without melting solder or using a chip bonder. Furthermore, a module according to the present invention can be fabricated by using a simple process without requiring a complicated process, such as complicated optical axis adjustment work and embedding an optical element in a semiconductor substrate. Therefore, the module can be provided inexpensively

DETAILED DESCRIPTION OF THE INVENTION

Hereafter, embodiments of the present invention will be described in detail with reference to the accompanying drawings, in order to clarify the above-described and other objects, features and advantages of the present invention.

First Embodiment

Figure 1A:
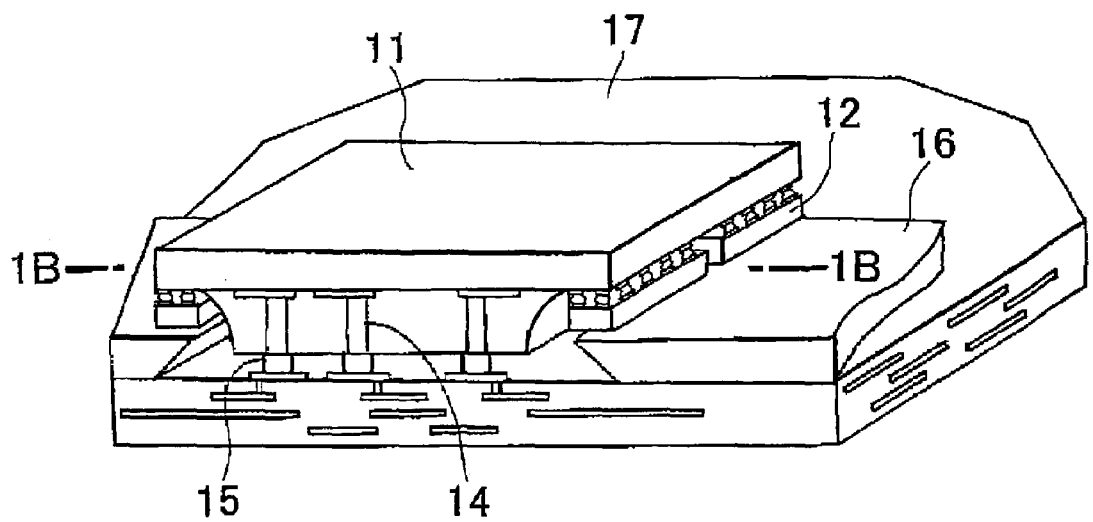
FIG. 1A is an oblique view showing a structure for mounting an LSI package having an optical interface onto a photoelectric wiring board according to a conventional technique.
Figure 1B:
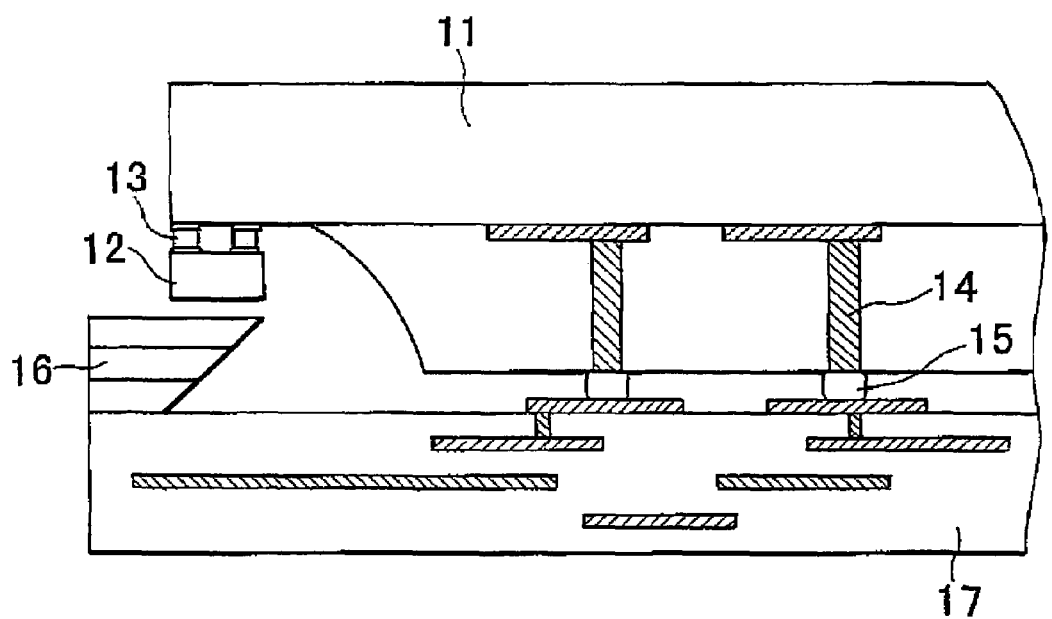
FIG. 1B is a sectional view showing a structure for mounting an LSI package having an optical interface onto a photoelectric wiring board according to a conventional technique.
Figure 2:
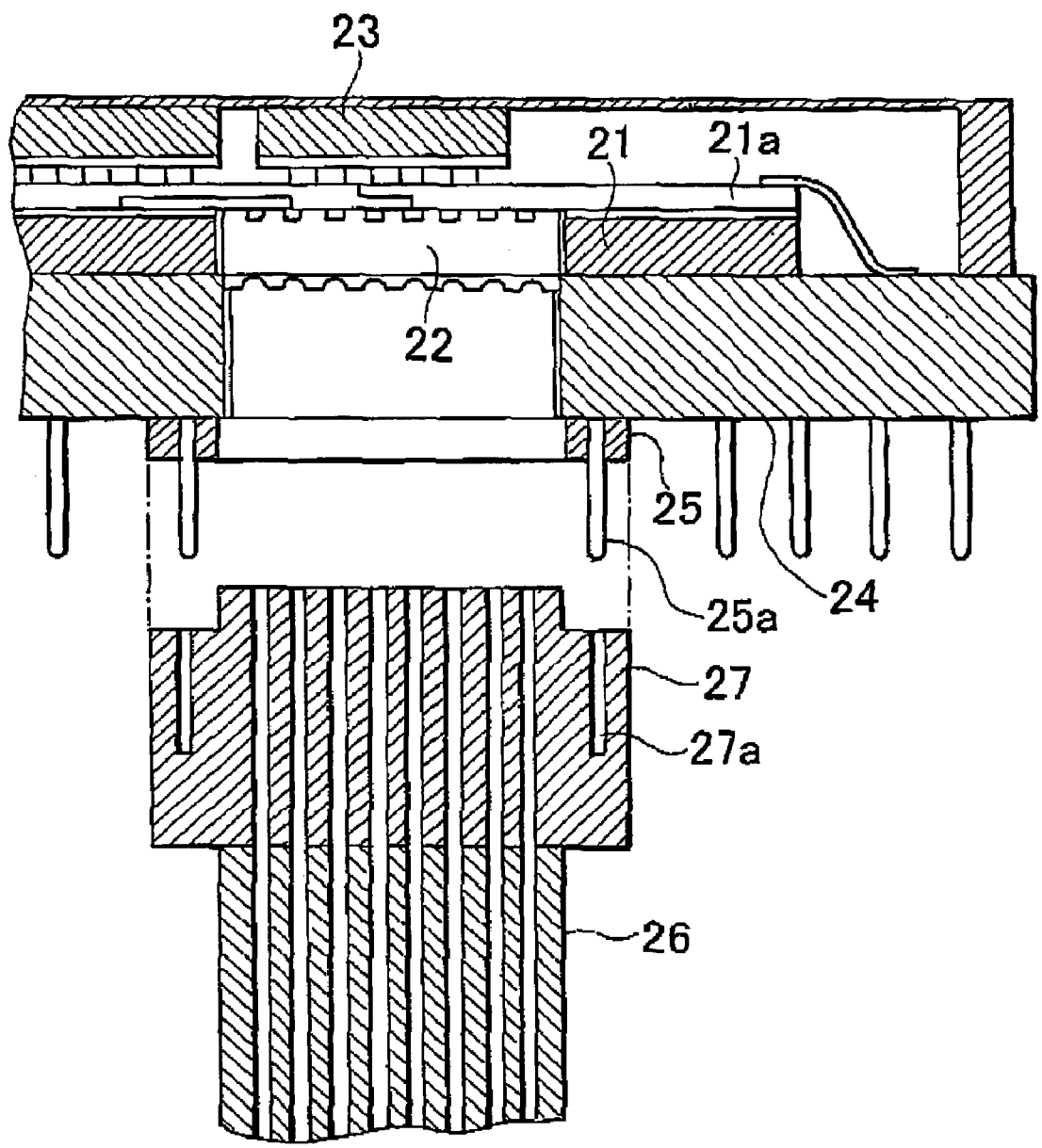
FIG. 2 is a sectional view showing a structure for connecting an optical interface to an optical fiber according to another conventional technique.
Figure 3:
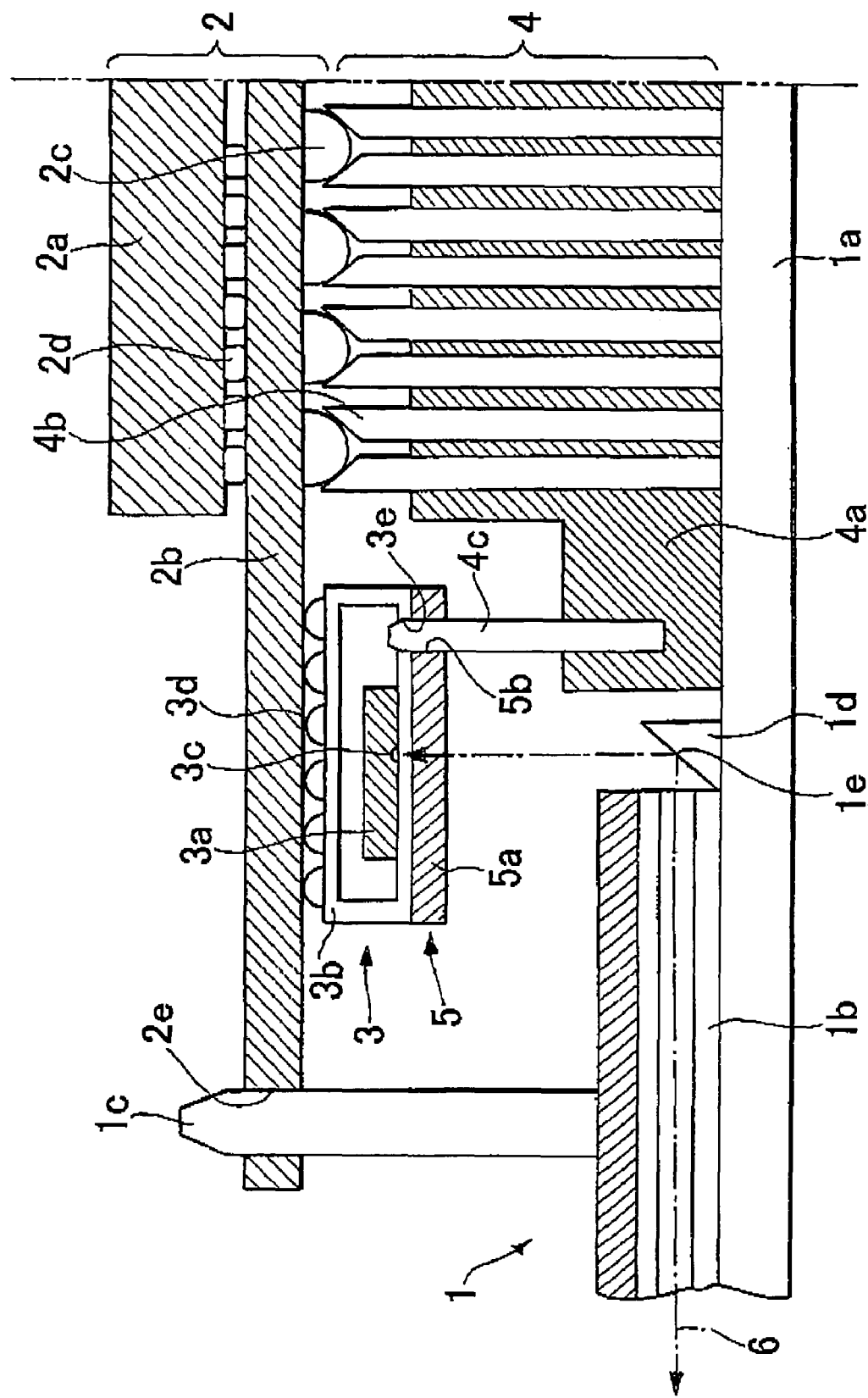
FIG. 3 is a sectional view showing a structure in a first embodiment according to the present invention.

FIG. 3 is a sectional view showing a structure in a first embodiment according to the present invention. A module in the present embodiment is formed to have bilateral symmetry. Therefore, only the left half of the module is shown to make it easy to see FIG. 3. An optical transmission and conversion module in the present embodiment includes a photoelectric wiring board 1, an LSI package 2, an optical interface 3, a wiring board side guide member 4 positioned at high precision with respect to the photoelectric wiring board 1 and stuck thereto, and an optical interface side guide member 5 positioned at high precision with respect to the optical interface 3 and stuck thereto.

The photoelectric wiring board 1 includes a print-circuit board 1a having wiring and terminals (pads) formed thereon, optical transmission lines 1b having a plurality of cores in a direction perpendicular to the paper, guide bars 1c planted on the print-circuit board 1a, and mirrors 1d for converting an optical path by 90°. As the material of the print-circuit board 1a, an organic material such as glass epoxy, ceramics, or glass is used.

In the present embodiment, the optical transmission line 1b is formed directly on the print-circuit board 1a. Instead of the method for forming the optical transmission line directly on the print-circuit board, an optical fiber cable formed separately may be stuck on the print-circuit board. The optical transmission line 1b is formed of a resin material such as polyimide, epoxy or acrylic resins, or a quartz material. The core section dimension of the optical transmission line is 30 to 40 µm square in the multi-mode optical transmission line, and it is 5 to 10 µm square in the single-mode optical transmission line. As for the structure of the optical transmission line, the core is interposed between upper and lower claddings. Each of the claddings has a thickness in the range of 30 to 40 µm in the multi-mode, and has a thickness in the range of 10 to 15 µm in the single-mode.

The guide bar 1c is a metal bar for coarsely positioning the LSI package 2. The guide bar 1c can have a round shape, an elliptical shape, or a polygonal shape as its sectional shape. The desirable shape is a round shape or a square shape. The length of the diameter or one side of the guide bar 1c is in the range of approximately 1 to 10 mm. The top of the guide bar 1c is tapered.

The mirror 1d reflects an optical beam 6 propagated through the optical transmission line 1b, and an optical beam input to or output from the optical interface 3. The mirror 1d has an isosceles triangle as its sectional shape. The mirror 1d has a metal film formed on the surface of a metal, glass or resin molded component. The mirror 1d is positioned by using the optical transmission line 1b as its reference, and the mirror 1d is stuck on the print-circuit board 1a.

The LSI package 2 is formed by mounting an LSI chip 2a on an interposer 2b via bumps 2d. Bumps 2c are formed on an under surface of the interposer 2b to obtain electrical connections to the print-circuit board 1a. Fitting holes 2e are formed in four corners of the interposer 2b to fit the guide bars 1c into them. The fitting holes 2e have a round shape, an elliptical shape, or a polygonal shape as their plane shape so as to be associated with the sectional shape of the guide bars 1c. It is desirable that the fitting holes 2e have a dimension that is equal to or slightly less than a value obtained by adding 200 μm to the outside diameter or the length of one side of the guide bars 1c.

A circuit for driving an optical element (a semiconductor laser or a photodiode) mounted on the optical interface 3, a circuit for processing an output signal of the optical element, or both of them is mounted on the LSI chip 2a. An underfill can be formed between the LSI chip 2a and the interposer 2b. Furthermore, the LSI chip 2a can be sealed with resins.

As for the optical interface 3, the optical element 3a is accommodated in a receptacle 3b. In the optical element 3a, a plurality of semiconductor lasers or photodiodes are formed in a direction perpendicular to the paper. The semiconductor lasers are vertical cavity surface emitting lasers, and their oscillation wavelength is 850 nm, 980 nm, 1,100 nm or 1,310 nm. The number of optical input & output points per optical element is four, eight or twelve. In the present embodiment, the optical interface 3 is mounted on the interposer 2b via bumps 3d. The optical element 3a in the optical interface 3 is electrically connected to the LSI chip 2a via the bumps 3d and terminals and wiring (both of which are not illustrated) on the interposer 2b. An opening 3e is formed in the receptacle 3b to fit a guide pin described later into it.

The wiring board side guide member 4 is a precision resin molded component. The wiring board side guide member 4 includes a guide member main body 4a made of resin such as epoxy resin, and socket pins 4b and guide pins 4c molded to be integral with the main body. The guide member main body 4a has a thickness (height of a portion in which the socket pins 4b are planted) in the range of approximately 500 μm to 1 mm. The guide member main body 4a may also be formed of an inorganic material such as glass. In the present embodiment, the socket pins 4b and the guide pins 4c are made integral with the guide member main body 4a at the time of molding. Alternatively, the socket pins 4b and/or the guide pins 4c may be fitted into holes formed through the guide member main body 4a. In the present embodiment, the socket pins 4b are platelike metal pieces. Alternatively, the socket pins 4b may be formed of needle-like metal or helical metal wires. It is desirable to cover the surface of the socket pins 4b with a metal material that is not susceptible to oxidation, such as gold, by using plating or the like.

The guide pin 4c is a metal bar for conducting relative positioning between the photoelectric wiring board 1 and the optical interface 3. The guide pin 4c can have a round shape, an elliptical shape, or a polygonal shape as its sectional shape. The desirable shape is a round shape or a square shape. The length of the diameter or one side of the guide bar 4c is in the range of approximately 0.5 to 1 mm. The top of the guide bar 4c is tapered.

The wiring board side guide member 4 is positioned and stuck on the photoelectric wiring board 1. The sticking is conducted by, for example, soldering the socket pins 4b of the wiring board side guide member 4 to terminals (not illustrated) on the print-circuit board 1a. Solder bumps can be formed on either lower ends of the socket pins 4b or the terminals on the print-circuit board 1a, and soldering can be conducted by using the solder bumps. For example, when a multi-mode optical transmission line is used, it is desirable to set the mounting precision of the guide member 4 to 10 μm or less.

The optical interface side guide member 5 is a precision resin molded component. The optical interface side guide member 5 includes a guide member main body 5a made of resin such as transparent epoxy resin. A fitting hole 5b is formed through the guide member main body 5a to fit the guide pin 4c into it. The guide member main body 5a has a thickness in the range of approximately 500 μm to 1 mm. The fitting holes 5b have a round shape, an elliptical shape, or a polygonal shape as their cross section plane shape so as to be associated with the external shape of the guide pins 4c. It is desirable that the fitting holes 5b have a dimension that is equal to or slightly less than a value obtained by adding 10 μm to the outside diameter or the length of one side of the guide pins 4c. The guide member main body 5a may also be formed of an inorganic material such as glass.

The optical interface side guide member 5 is positioned and glued to a side of an optical input & output point 3c of the optical interface 3. In the present embodiment, the guide member 6 is glued to the optical interface 3 and then the optical interface 3 is mounted on the interposer 2b of the LSI package 2. Alternatively, this order may be reversed. For example, when a multi-mode optical transmission line is used, it is desirable to set the precision in mounting the guide member 5 onto the optical interface 10 μm or less.

For mechanically positioning the optical interface 3 and the photoelectric wiring board 1, it is necessary to provide a fitting hole in the optical interface 3 to fit the guide pin 4c of the photoelectric wiring board 1 side into the fitting hole. The optical element 3a serving as the position reference of the optical input & output point of the optical interface 3 is typically used in, for example, connection of a fiber array connector. The optical element 3a is minute and weak in strength as compared with the guide pin having a thickness of 0.7 mm. Therefore, it is difficult to provide such a mechanism directly in the optical element at high precision by using punching or the like. In the present embodiment, therefore, the guide member 5 formed of an optically transparent material is fabricated at high precision separately, and mounted on the optical interface 3. The fitting hole 5b is formed through the optical interface side guide member 5.

By the way, the connection between the optical interface and the photoelectric wiring board is not restricted to fitting between the fitting pin and the fitting hole. It is also possible to use a fitting structure in which a convex portion formed on one of the guide member of the optical interface and the guide member of the photoelectric wiring board is inserted into and connected to the other of them. It is also possible to use a fitting structure in which one of the guide member of the optical interface and the guide member of the photoelectric wiring board is inserted into and connected to a difference in level formed on the other of them.

In the present embodiment, the interposer is used to eliminate the difference between the pitch of the terminals of the LSI and the pitch of the terminals of the optical interface. If components having no pitch difference and a configuration that is not affected by a pitch difference are used, it is not necessary to use the interposer.

A mounting method for the optical transmission and conversion module in the first embodiment shown in FIG. 3 will now be described. First, the wiring board side guide member 4 is positioned with respect to the photoelectric wiring board 1 by using an optical input & output point 1e of the photoelectric wiring board 1 and the position of the guide pin 4c of the wiring board side guide member 4 as reference. The socket pins 4b are soldered to terminals (not illustrated) on the print-circuit board 1a. As a result, the guide member 4 is mounted on the photoelectric wiring board 1. The guide member 4 is held in the fixed state when solder is molten. In positioning the wiring board side guide member 4 to the photoelectric wiring board 1, the position of the optical input & output point 1e of the photoelectric wiring board side is ascertained by, for example, inputting light into the optical transmission line and observing a position where the light is reflected by the mirror 1d. On the other hand, the optical interface side guide member 5 is positioned by using the position of the optical input & output point 3c of the optical element 3a accommodated in the optical interface 3 and the fitting hole 5b as the reference, and glued and fixed to the optical interface 3. Subsequently, the optical interface 3 is mounted on the LSI package 2 by soldering the bumps 3d of the optical interface 3 to the terminals (not illustrated) on the interposer 2b. Subsequently, the guide bar 1c of the photoelectric wiring board 1 is fitted into the fitting hole 2e of the LSI package 2, and the LSI package 2 is presses downward. Thereupon, the guide pin 4c of the wiring board side guide member 4 is inserted and fitted into the fitting hole 5b of the optical interface side guide member 5. As a result, position alignment between the optical interface 3 and the photoelectric wiring board 1 is attempted, and the optical input & output point 3c of the optical interface is aligned in position with the optical input & output point 1e of the mirror 1d. At the same time, the bumps 2c of the LSI package 2 are brought into contact with the socket pins 4b of the wiring board side guide member 4, and electrical connection between the photoelectric wiring board 1 and the LSI package 2 is achieved. At this time, electrical connection is possible if the bumps 2c and the socket pins 4b are in the range of elastic contact. Therefore, slight misalignment between the photoelectric wiring board 1 and the LSI package 2 can be absorbed. Pushing pressure is always applied from above to the LSI package so as to bring the bumps 2c of the LSI package 2 into contact with the socket pins 4b with a definite or higher contact pressure.

Second Embodiment

Figure 4:
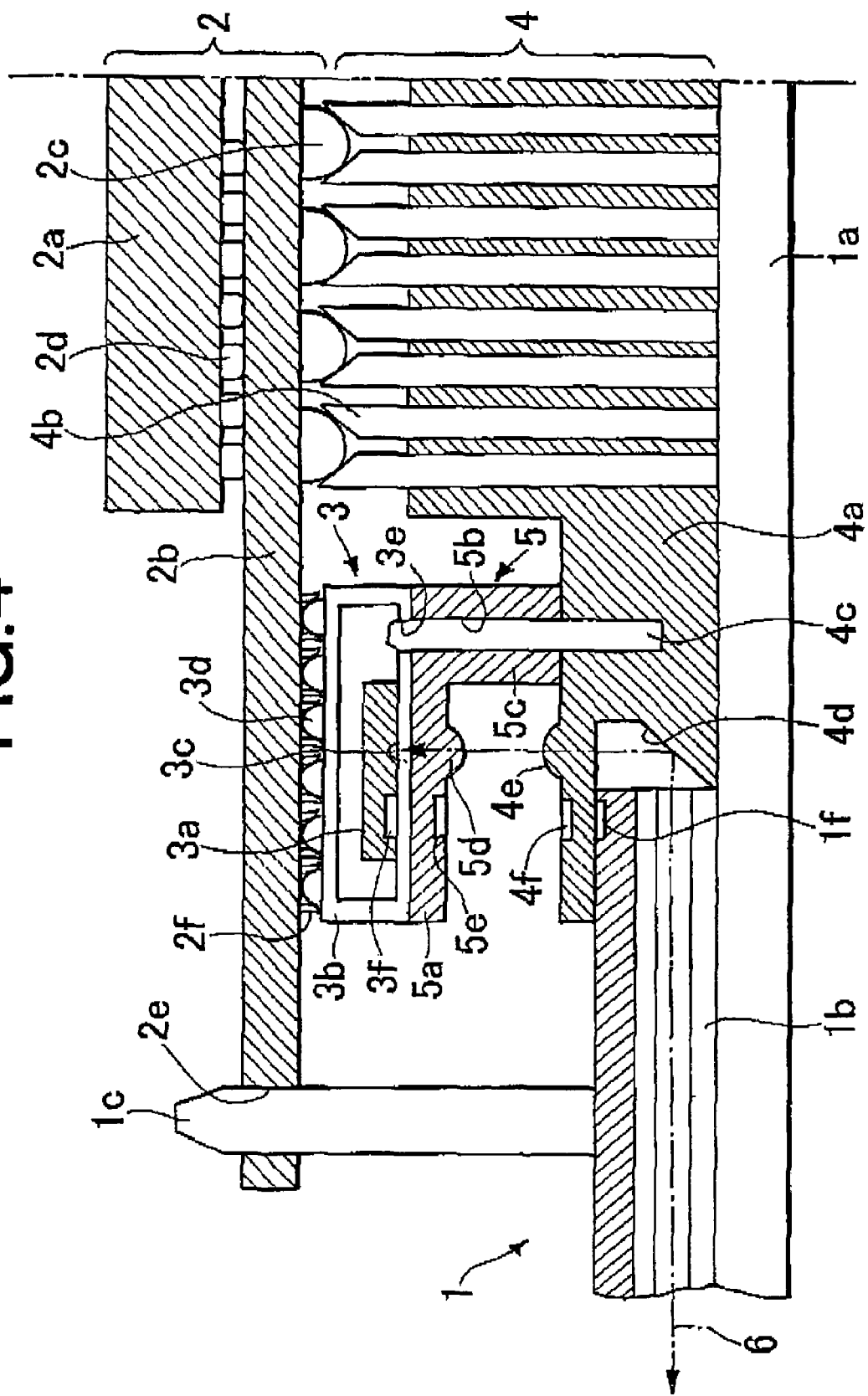
FIG. 4 is a sectional view showing a structure in a second embodiment according to the present invention.

FIG. 4 is a sectional view showing a structure in a second embodiment according to the present invention. A module in the present embodiment is also formed to have bilateral symmetry. Therefore, only the left half of the module is shown to make it easy to see FIG. 4. An optical transmission and conversion module in the present embodiment includes a photoelectric wiring board 1, an LSI package 2, an optical interface 3, a wiring board side guide member 4 positioned at high precision with respect to the photoelectric wiring board 1 and stuck thereto, and an optical interface side guide member 5 positioned at high precision with respect to the optical interface 3 and stuck thereto.

The photoelectric wiring board 1 includes a print-circuit board 1a having wiring and terminals (pads) formed thereon, optical transmission lines 1b having a plurality of cores in a direction perpendicular to the paper, and guide bars 1c planted on the print-circuit board 1a. Alignment marks if are formed on the optical transmission lines 1b by using the photomechanical process. It is desirable that the position precision of the alignment mark 1f to the optical transmission line 1b is 10 μm or less.

The LSI package 2 is formed by mounting an LSI chip 2a on an interposer 2b via blimps 2d. Bumps 2c for obtaining electrical connections to the print-circuit board 1a and socket pins 2f for obtaining electrical connections to the optical interface 3 are provided on an under surface of the interposer 2b. Furthermore, fitting holes 2e are formed in four corners of the interposer 2b to fit the guide bars 1c into them.

As for the optical interface 3, the optical element 5a is accommodated in a receptacle 3b. In the receptacle 3b, an opening 3e is formed to fit the guide pin 4c in it. Bumps 3d are provided on the surface of the receptacle 3b. An alignment mark 3f is formed on the optical input & output surface of the optical element 3a. The alignment mark 3f is formed with respect to an optical input & output point 5c with high position precision.

The wiring board side guide member 4 is a precision resin molded component. The wiring board side guide member 4 includes a guide member main body 4a made of resin such as epoxy resin, and socket pins 4b and guide pins 4c molded to be integral with the main body. The guide member main body 4a may also be formed of an inorganic material such as glass. In the present embodiment, a mirror 4d and a lens 4e are made integral with the guide member main body 4a. Furthermore, an alignment mark 4f is formed. It is desirable that the relative position precision of the mirror 4d, the lens 4e, the alignment mark 4f, and the guide pin 4c is 10 μm or less. The mirror 4d is disposed in a position where an optical axis of the optical transmission line 1b intersects an optical axis of the optical element 3a. The mirror 4d is formed so as to be inclined at an angle of 45° to the optical axis of the optical transmission line and the optical axis of the optical element. In order to prevent loss caused by light scattering, the surface roughness of the mirror surface is made sufficiently small. In order to raise the reflectance of the mirror, it is desirable to cover the surface with gold, aluminum or titanium.

According to the present embodiment, in the guide member 4, the position relations among the guide pin 4c, the mirror 4d, the lens 4e, and the alignment 4f can be raised in precision at the time of fabrication by using monobloc molding. In addition, the precision of the optical axis alignment between the optical interface 3 and the photoelectric wiring board 1 can be improved. Furthermore, since it becomes unnecessary to conduct alignment work among the guide pin 4c, the mirror 4d, the lens 4e, and the alignment 4f when mounting the LSI package, the manufacturing cost can be reduced.

The optical interface side guide member 5 is a precision resin molded component. A guide member main body 5a made of resin such as transparent epoxy resin includes a spacer portion 5c and a lens 5d. Furthermore, a fitting hole 5b for fitting the guide pin 4c therein and an alignment mark 5e for position alignment are formed. It is desirable that the relative position precision between the alignment mark 5e and the fitting hole 5b is 10 μm or less.

In the present embodiment, the spacer portion 5c which comes in contact with the wiring board side guide member 4 is provided in the optical interface side guide member 5. As a result, the distance between the reflection point of the mirror 4d and the optical input & output point of the optical element 3a can be made constant with high precision. In the present embodiment, the spacer portion is provided in the guide member of the optical interface side. Alternatively, the spacer portion may be provided in the guide member 4 of the wiring board side.

By the way, the connection between the optical interface and the photoelectric wiring board is not restricted to fitting between the fitting pin and the fitting hole. It is also possible to use a fitting structure in which a convex portion formed on one of the guide member of the optical interface and the guide member of the photoelectric wiring board is inserted into and connected to the other of them. It is also possible to use a fitting structure in which one of the guide member of the optical interface and the guide member of the photoelectric wiring board is inserted into and connected to a difference in level formed on the other of them.

Furthermore, in the present embodiment, the socket pins for obtaining electrical connections to the bumps of the optical interface are provided on the under surface of the interposer. However, the connection form is not restricted to this. Bumps may be provided on the under surface of the interposer and connected to socket pins provided on the top surface of the optical surface. Male and female socket pins may be provided on the under surface of the interposer and the top surface of the optical interface and connected to each other.

In the present embodiment, the bumps for obtaining electrical connections to the socket pins of the photoelectric wiring board are provided on the under surface of the interposer. However, the connection form is not restricted to this.

Socket pins may be provided on the under surface of the interposer and connected to bumps of the photoelectric wiring board. Male and female socket pins may be provided on the under surface of the interposer and the photoelectric wiring board and connected to each other.

In the present embodiment, the interposer is used to eliminate the difference between the pitch of the terminals of the LSI and the pitch of the terminals of the optical interface. If components having no pitch difference and a configuration that is not affected by a pitch difference are used, it is not necessary to use the interposer.

Figure 5:
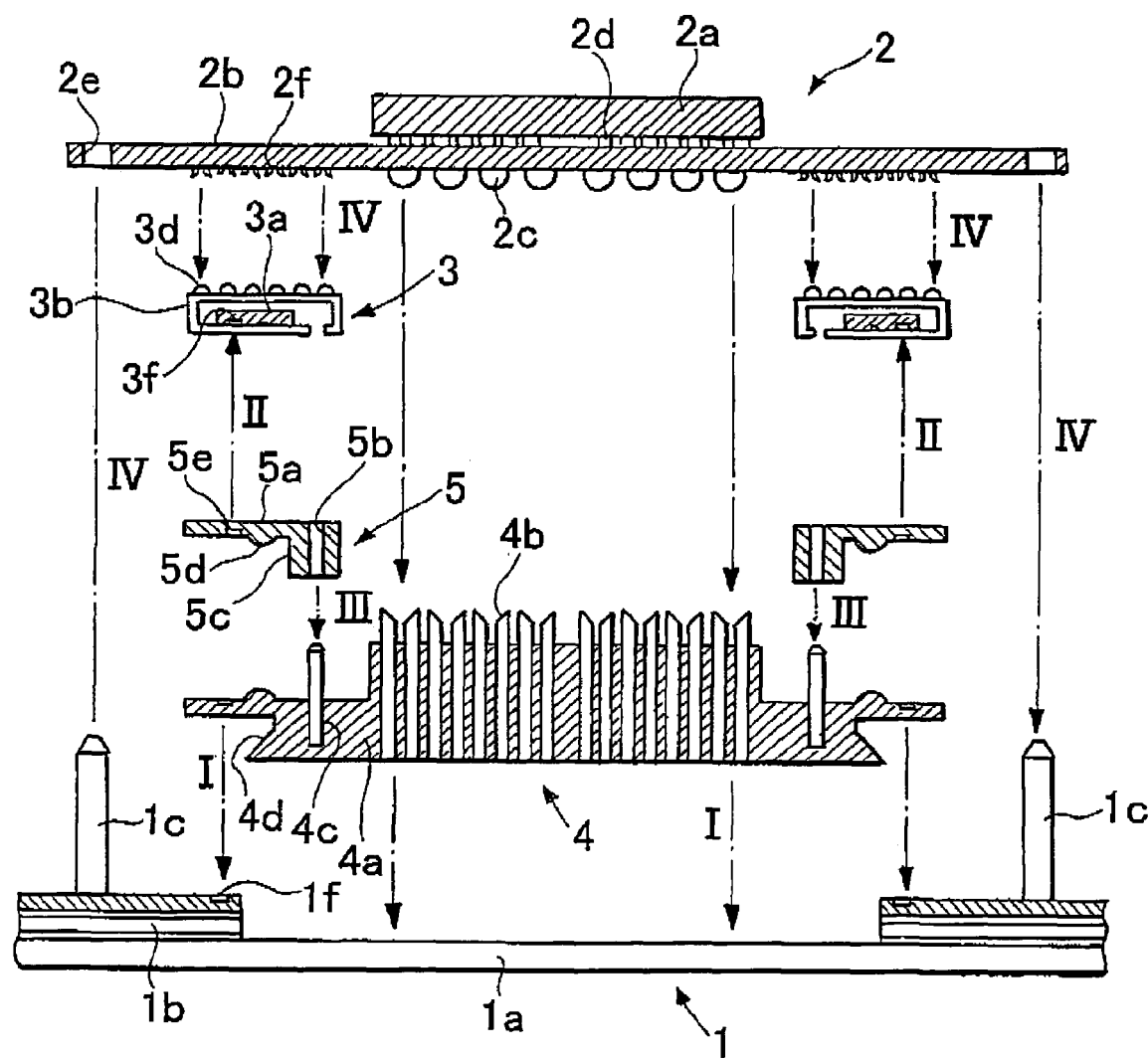
FIG. 5 is an exploded view showing a mounting method in a second embodiment according to the present invention.

A mounting method for the optical transmission and conversion module in the second embodiment will now be described with reference to FIG. 5. The alignment mark 4f of the guide member side is aligned with the alignment mark 1f of the photoelectric wiring board side. The wiring board side guide member 4 is thus mounted on the surface of the photoelectric wiring board 1 and fixed by soldering (as indicated by arrows I in FIG. 5). The optical axis aligning precision between the optical interface and the photoelectric wiring board can be improved by conducting the positioning using the alignment marks. Furthermore, the alignment mark 5e of the guide member side is aligned with the alignment mark 3f. The optical interface side guide member 5 is thus glued and fixed to the optical interface 3 (as indicated by arrows II in FIG. 5). Positioning with higher precision is made possible in the same way as the photoelectric wiring board side by using the alignment marks. Subsequently, the optical interface 3 made integral with the guide member 5 is attached to the wiring board side guide member 4 by fitting the guide pins 4c of the wiring board side guide member 4 into the fitting holes 5b of the guide member 5 (as indicated by III in FIG. 5). As a result, the optical interface 3 is mechanically positioned to and mounted on the photoelectric wiring board 1 with high precision. Optical connection between the optical transmission line 1b of the photoelectric wiring board 1 and the optical element 3a of the optical interface 3 is achieved. Subsequently, the guide bars 1c of the photoelectric wiring board 1 are inserted into the fitting holes 2e of the LSI package 2. A pushing pressure is applied to the LSI package 2 to fit the guide bars 1c into the fitting holes 2e (as indicated by arrows IV in FIG. 5). As a result, the bumps 3d of the optical interface 3 come in contact with the socket pins 2f of the LSI package 2, and the bumps 2c of the LSI package 2 come in contact with the socket pins 4b of the guide member 4. Thus, electrical connections between the optical interface 3 and the LSI package 2 and between the LSI package 2 and the photoelectric wiring board 1 are obtained.

According to the present embodiment, the electrical connection to the bumps 3d of the optical interface 3 is maintained by elastic force of the socket pins 2f of the LSI package 2. Even if there is a relative position error between optical interfaces when mounting the LSI package 2 including a plurality of optical interfaces 3, it is possible to absorb the relative position error and mount a plurality of optical interfaces 3 on the LSI package 2 as long as the mounting position error is in the range over which the elastic force of the socket pins 2f extends.

Furthermore, according to the present embodiment, components can be replaced easily on the maintenance spot without using special equipment, when a trouble has occurred in either the LSI package 2 or the optical interface 3.

Third Embodiment

Figure 6:
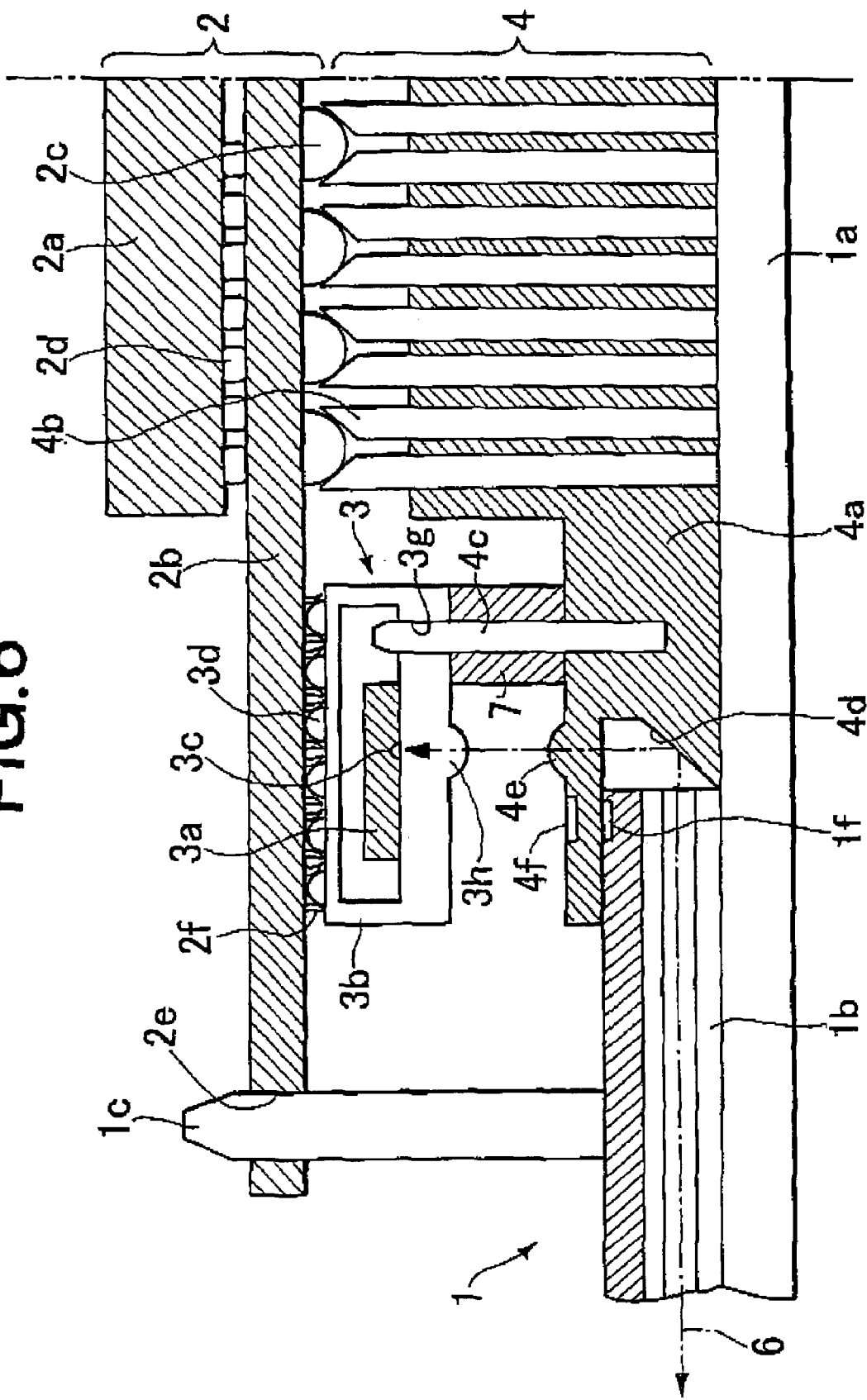
FIG. 6 is a sectional view showing a structure in a third embodiment according to the present invention.

FIG. 6 is a sectional view showing a structure in a third embodiment according to the present invention. A module in the present embodiment is also formed to have bilateral symmetry. Therefore, only the left half of the module is shown to make it easy to see FIG. 6. A photoelectric wiring board 1, an LSI package 2, and a wiring board side guide member 4 in the present embodiment are the same as those shown in FIGS. 4 and 5. Therefore, description concerning them will be omitted, and only the optical interface 3 will now be described.

An optical interface side guide member is not mounted on the optical interface 3 in the present embodiment. The receptacle 3b of the optical interface 3 in the present embodiment can be regarded as a receptacle made integral with the guide member. The receptacle 3b of the optical interface 3 in the present embodiment can function as the guide member. As shown in FIG. 6, a fitting hole 3g is formed in the receptacle 3b accommodating the optical element 3a to fit the guide pin 4c of the wiring board side guide member 4 therein. Furthermore, bumps 3d and a lens 3h are provided on the surface of the receptacle 3b. By the way, the connection between the optical interface and the photoelectric wiring board is not restricted to fitting between the fitting pin and the fitting hole. It is also possible to use a fitting structure in which a convex portion formed on one of the guide member of the optical interface and the guide member of the photoelectric wiring board is inserted into and connected to the other of them. It is also possible to use a fitting structure in which one of the guide member of the optical interface and the guide member of the photoelectric wiring board is inserted into and connected to a difference in level formed on the other of them.

Furthermore, in the present embodiment, the socket pins for obtaining electrical connections to the bumps of the optical interface are provided on the under surface of the interposer. However, the connection form is not restricted to this. Bumps may be provided on the under surface of the interposer and connected to socket pins provided on the top surface of the optical surface. Male and female socket pins may be provided on the under surface of the interposer and the top surface of the optical interface and connected to each other.

In the present embodiment, the bumps for obtaining electrical connections to the socket pins of the photoelectric wiring board are provided on the under surface of the interposer. However, the connection form is not restricted to this.

Socket pins may be provided on the under surface of the interposer and connected to bumps of the photoelectric wiring board. Male and female socket pins may be provided on the under surface of the interposer and the photoelectric wiring board and connected to each other.

In the present embodiment, the interposer is used to eliminate the difference between the pitch of the terminals of the LSI and the pitch of the terminals of the optical interface. If components having no pitch difference and a configuration that is not affected by a pitch difference are used, it is not necessary to use the interposer.

A mounting method for the third embodiment will now be described. The alignment mark 4f of the guide member side is aligned with the alignment mark 1f of the photoelectric wiring board side. The wiring board side guide member 4 is thus mounted on the surface of the photoelectric wiring board 1 and fixed by soldering. Subsequently, the guide pin 4c of the wiring board side guide member 4 is inserted into a hole of a spacer 7, and then the guide pin 4c is fitted into the fitting hole 3g of the optical interface 3. The optical interface 3 is thus attached to the wiring board side guide member 4. As a result, the optical interface 3 is mechanically positioned to and mounted on the photoelectric wiring board 1 with high precision. Optical connection between the optical transmission line 1b of the photoelectric wiring board 1 and the optical element 3a of the optical interface 3 is achieved. Subsequently, the guide bars 1c of the photoelectric wiring board 1 are inserted into the fitting holes 2e of the LSI package 2. A pushing pressure is applied to the LSI package 2 to fit the guide bars 1c into the fitting holes 2e. As a result, the bumps 3d of the optical interface 3 come in contact with the socket pins 2f of the LSI package 2, and the bumps 2c of the LSI package 2 come in contact with the socket pins 4b of the guide member 4. Thus, electrical connections between the optical interface 3 and the LSI package 2 and between the LSI package 2 and the photoelectric wiring board 1 are obtained.

Figure 7:
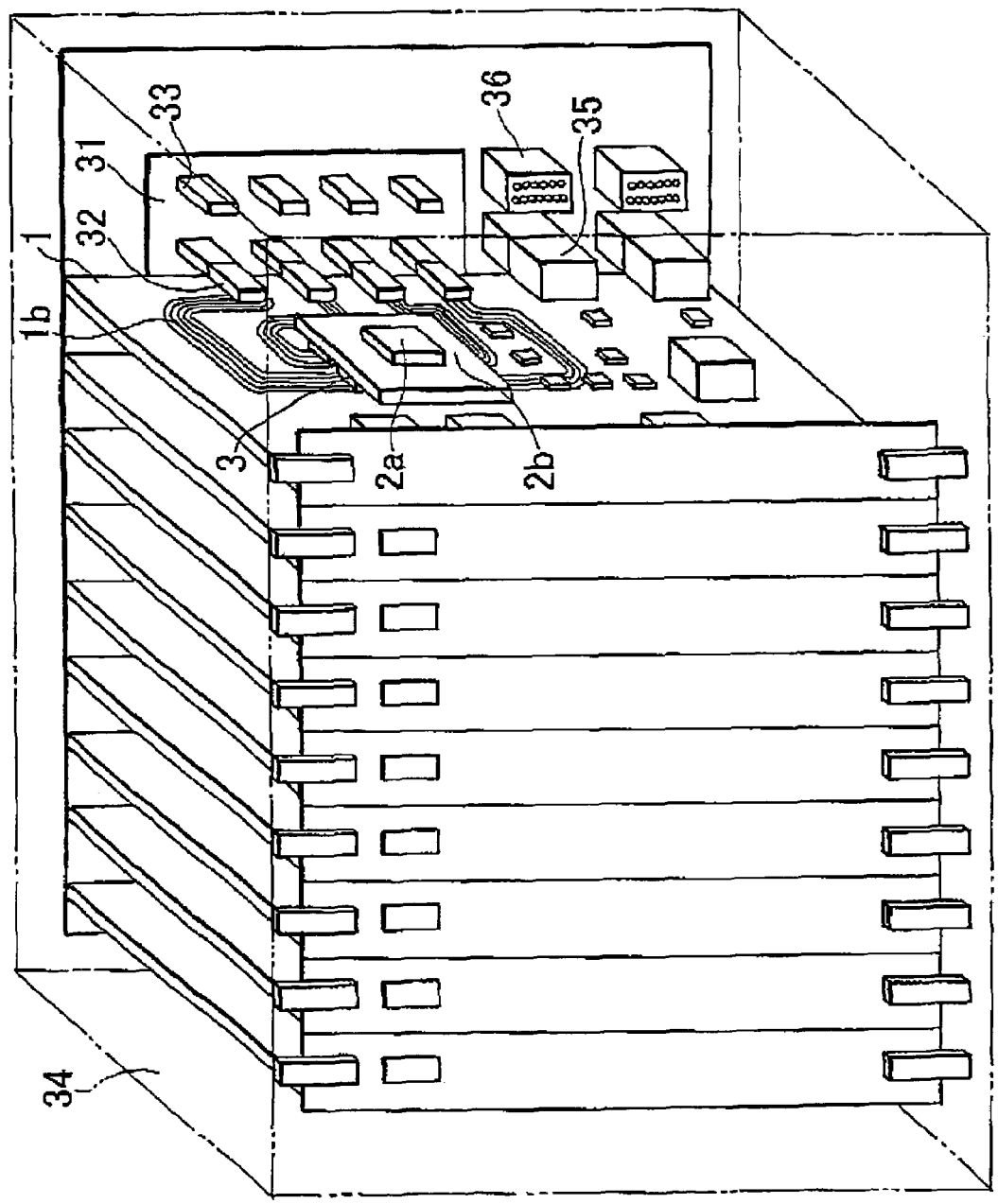
FIG. 7 shows an information processing apparatus in a fourth embodiment of the present invention.

A fourth embodiment of the present invention will now be described. FIG. 7 is a configuration diagram of an information processing apparatus using a board according to the present invention. In this information processing apparatus, a plurality of photoelectric wiring boards 1 are electrically and optically connected to a photoelectric backplane 31 disposed at the back of the apparatus. Electrical connection between the photoelectric wiring boards and the photoelectric backplane are obtained by connecting electric connectors 35 of the photoelectric wiring boards to electric connectors 36 of the photoelectric backplane. At the same time, they are optically connected by connecting optical connectors 32 of the photoelectric wiring boards to optical connectors 33 of the photoelectric backplane. Optical wires and electric wires, which are not illustrated, are connected on the photoelectric backplane. As a result, optical and electrical interconnections between photoelectric wiring boards are made. The interposer 2b having the LSI chip 2a on its top surface and the optical interface 3 on its under surface is mounted on each of the photoelectric wiring boards with a light sending & sending surface of the optical interface aligned in optical axis with a light sending & receiving point of the optical transmission line 1b. Owing to the configuration heretofore described, signal connection between an LSI chip mounted onto a photoelectric wiring board and an LSI chip mounted on a different photoelectric wiring board is conducted using an optical signal.

Heretofore, embodiments of the present invention have been described. However, the present invention is not limited to the embodiments, but suitable alterations are possible without departing from the spirit of the invention. For example, the guide bars 1c and guide pin 4c may be planted on the LSI package 2 side and on the optical interface side guide member 5, respectively.

Furthermore, instead of the guide pins 4c, it is possible to form bosses on one of the guide members 4 and 5 and fit the bosses into fitting holes formed on the other of them. Or it is also possible to form fitting holes in both the guide members 4 and 5 and fit guide pins into the fitting holes of the both guide members. In the embodiments, the optical path conversion for light propagated through the optical transmission line is conducted by the mirror disposed outside the optical transmission line. Instead of this system, it is also possible to cut off the end face of the optical transmission line at an angle of 45° and reflect light by the end face.

What is claimed is:

1. A structure for mounting an LSI package onto a photoelectric wiring board, the structure comprising:
   a photoelectric wiring board comprising an optical transmission line;
   an LSI chip electrically connected to the photoelectric wiring board via an interposer; and
   an optical interface for accommodating an optical element optically coupled to the optical transmission line, the optical interface being electrically connected to the LSI chip, wherein,
   a first guide member and a second guide member are stuck to the photoelectric wiring board and the optical interface, respectively,
   the first guide member and the second guide member are positioned to each other and mechanically coupled to each other,
   a fitting projection is formed on one of the first and second guide members; and
   a fitting hole is formed on the other of the first and second guide members, and
   positioning is conducted by fitting the fitting projection into the fitting hole.

2. The structure for mounting an LSI package onto a photoelectric wiring board according to claim 1, wherein
   the fitting projection comprises a guide pin partially embedded in the first or second guide member, or
   the fitting projection is formed integrally with the first or second guide member by monobloc molding.

3. The structure for mounting an LSI package onto a photoelectric wiring board according to claim 1,
   the fitting projection comprises a guide pin,
   there is a fitting hole formed on the one of the first and second guide members, and
   positioning is conducted by fitting the guide pin into fitting holes formed on the first and second guide members.

4. The structure for mounting an LSI package onto a photoelectric wiring board according to claim 1, wherein the photoelectric wiring board or the optical interface is in elastic contact with the LSI chip to electrically connect the photoelectric wiring board or the optical interface to the LSI chip.

5. The structure for mounting an LSI package onto a photoelectric wiring board according to claim 4, wherein the elastic contact is obtained using socket pins.

6. The structure for mounting an LSI package onto a photoelectric wiring board according to claim 5, wherein the first guide member comprises the socket pins in a mode in which the socket pins are partially embedded in the first guide member, or in a mode in which the socket pins are formed integrally with the first guide member by monobloc molding.

7. The structure for mounting an LSI package onto a photoelectric wiring board according to claim 6, wherein
a guide is disposed in one of the photoelectric wiring board and the interposer,
a fitting hole is provided in the other of the photoelectric wiring board and the interposer, and
the guide is fitted into the fitting hole.

8. The structure for mounting an LSI package onto a photoelectric wiring board according to claim 1, wherein
the LSI chip is mounted on an interposer, and
the LSI chip and the photoelectric wiring board and/or the optical interface are electrically connected to each other via wiring laid on the interposer.

9. The structure for mounting an LSI package onto a photoelectric wiring board according to claim 8, wherein
the optical interface is in elastic contact with the LSI chip or the interposer to electrically connect the optical interface to the LSI chip or the interposer.

10. The structure for mounting an LSI package onto a photoelectric wiring board according to claim 9, wherein the elastic contact is obtained using socket pins.

11. The structure for mounting an LSI package onto a photoelectric wiring board according to claim 10, wherein
the first guide member comprises the socket pins in a mode in which the socket pins are partially embedded in the first guide member, or in amode in which the socket pins are formed integrally with the first guide member by monobloc molding.

12. The structure for mounting an LSI package onto a photoelectric wiring board according to claim 11, wherein
a guide is disposed in one of the photoelectric wiring board and the interposer,
a fitting hole is provided in the other of the photoelectric wiring board and the interposer, and
the guide is fitted into the fitting hole.

13. The structure for mounting an LSI package onto a photoelectric wiring board according to claim 9, wherein
a guide is disposed in one of the photoelectric wiring board and the interposer,
a fitting hole is provided in the other of the photoelectric wiring board and the interposer, and
the guide is fitted into the fitting hole.

14. A structure for mounting an LSI package onto a photoelectric wiring board, the structure comprising:
a photoelectric wiring board comprising an optical transmission line;
an LSI chip electrically connected to the photoelectric wiring board; and
an optical interface for accommodating an optical element optically coupled to the optical transmission line, the optical interface being electrically connected to the LSI chip, wherein,
a first guide member and a second guide member are stuck to the photoelectric wiring board and the optical interface, respectively,
the first guide member and the second guide member are positioned to each other and mechanically coupled to each other,
the LSI chip is mounted on an interposer,
the LSI chip and the photoelectric wiring board and/or the optical interface are electrically connected to each other via wiring laid on the interposer,
a guide is disposed in one of the photoelectric wiring board and the interposer,
a fitting hole is provided in the other of the photoelectric wiring board and the interposer, and
the guide is fitted into the fitting hole.

15. A structure for mounting an LSI package onto a photoelectric wiring board, the structure comprising:
a photoelectric wiring board comprising an optical transmission line;
an LSI chip electrically connected to the photoelectric wiring board; and
an optical interface for accommodating an optical element optically coupled to the optical transmission line, the optical interface being electrically connected to the LSI chip, wherein,
a first guide member and a second guide member are stuck to the photoelectric wiring board and the optical interface, respectively,
the first guide member and the second guide member are positioned to each other and mechanically coupled to each other, and
alignment marks are formed on the photoelectric wiring board and the first guide member to position the first guide member with respect to the optical transmission line.

16. The structure for mounting an LSI package onto a photoelectric wiring board according to claim 1, wherein
the optical interface and the second guide member are formed as one body.

17. The structure for mounting an LSI package onto a photoelectric wiring board according to claim 1, wherein
alignment marks are formed on the optical interface and the second guide member to position the second guide member with respect to theoptical interface.

18. The structure for mounting an LSI package onto a photoelectric wiring board according to claim 1, wherein
the optical element is a surface emitting or receiving element, and
light propagated through the optical transmission line is subject to optical path conversion so as to cause an optical axis of the optical element, to become unparallel to an optical axis of the optical transmission line.

19. The structure for mounting an LSI package onto a photoelectric wiring board according to claim 18, wherein
a mirror for conducting optical path conversion on light propagated through the optical transmission line is disposed near an optical input & output point of the optical transmission line.

20. The structure for mounting an LSI package onto a photoelectric wiring board according to claim 19, wherein
a mirror is formed integrally with the first guide member.

21. The structure for mounting an LSI package onto a photoelectric wiring board according to claim 1, comprising:
spacer means for holding an optical path length between an optical input & output point of the optical interface and an optical input & output point of the optical transmission line or a mirror to a definite dimension.

22. The structure for mounting an LSI package onto a photoelectric wiring board according to claim 21, wherein the spacer means are formed so as to be integral with either the first guide member or the second guide member.

23. The structure for mounting an LSI package onto a photoelectric wiring board according to claim 1, comprising a lens between the optical element and the optical transmission line.

24. An information processing apparatus using an optical signal for signal transmission between LSIs or between an LSI and a backplane, wherein the structure for mounting an LSI package onto a photoelectric wiring board according to claim 1 is used in the transmission of the optical signal.

25. A method for fabricating a structure including a photoelectric wiring board having an optical transmission line, an LSI chip electrically connected to the photoelectric wiring board, and an optical interface for accommodating an optical element optically connected to the optical transmission line, the optical interface being electrically connected to the LSI chip, the method comprising:
 (1) a process for sticking an optical input & output point of the photoelectric wiring board to a predetermined point of a first guide member while keeping them in a predetermined relative position relation;
 (2) a process for sticking a light receiving & sending point of the optical interface to a predetermined point of a second guide member while keeping them in a predetermined relative position relation; and
 (3) a process for positioning the first guide member and the second guide member to each other and mechanically coupling them to each other so as to be separable, and thereby optically coupling the optical transmission line and the optical interface to each other, and electrically connecting the LSI chip to the photoelectric wiring board, wherein,
 a fitting projection is provided in one of the first guide member and the second guide member,
 a fitting hole is provided in the other of the first guide member and the second guide member, and
 the process (3) comprises the sub-processes of:
 coupling the first guide member to the second guide member by fitting the fitting projection into the fitting hole.

26. The method for mounting an LSI package onto a photoelectric wiring board according to claim 25, further comprising a process for mounting the LSI chip on an interposer.

27. The method for mounting an LSI package onto a photoelectric wiring board according to claim 26, wherein electrical connection between the optical interface and the interposer is achieved elastically in the process (3).

28. The method for mounting an LSI package onto a photoelectric wiring board according to claim 25, wherein the process (1) comprises the sub-processes of:
 causing light to be incident on the optical transmission line;
 positioning the first guide member by utilizing an optical path in the optical transmission line; and
 sticking the first guide member.

29. The mounting method for mounting an LSI package onto a photoelectric wiring board according to claim 25, wherein
 a mirror for converting an optical path so as to cause an optical axis of the optical element to become unparallel to an optical axis of the optical transmission line is installed near an optical input & output point of the optical transmission line, and
 the process (1) comprises the subprocesses of:
 positioning the first guide member by using an optical reflection point on the mirror as reference; and
 sticking the first guide member.

30. The mounting method for mounting an LSI package onto a photoelectric wiring board according to claim 25, wherein
 alignment marks are formed on the photoelectric wiring board and on the first guide member, and
 the process (1) comprises the sub-processes of:
 positioning the first guide member by utilizing the both alignment marks; and
 sticking the first guide member.

31. The mounting method for mounting an LSI package onto a photoelectric wiring board according to claim 25, wherein
 the process (2) comprises the subprocesses of:
 positioning the second guide member by using an optical input & output point in the optical interface as reference; and
 sticking the second guide member.

32. The mounting method for mounting an LSI package onto a photoelectric wiring board according to claim 25, wherein
 alignment marks are formed on the optical interface and the second guide member, and
 the process (2) comprises the sub-processes of:
 positioning the second guide member by utilizing the alignment marks of the optical element and the second guide member; and
 sticking the second guide member.

33. A method for fabricating a structure including a photoelectric wiring board having an optical transmission line, an LSI chip electrically connected to the photoelectric wiring board, and an optical interface for accommodating an optical element optically connected to the optical transmission line, the optical interface being electrically connected to the LSI chip, the method comprising:
 (1) a process for sticking an optical input & output point of the photoelectric wiring board to a predetermined point of a first guide member while keeping them in a predetermined relative position relation;
 (2) a process for sticking a light receiving & sending point of the optical interface to a predetermined point of a second guide member while keeping them in a predetermined relative positioh relation; and
 (3) a process for positioning the first guide member and the second guide member to each other and mechanically coupling them to each other so as to be separable, and thereby optically coupling the optical transmission line and the optical interface to each other, and electrically connecting the LSI chip to the photoelectric wiring board, wherein
 fitting holes are provided in the first guide member and the second guide member, and
 the process (3) comprises the subprocesses of:
 coupling the first guide member to the second guide member by fitting a guide pin into the fitting holes provided in the first guide member and the second guide member.

* * * * *